(12) United States Patent
Wang (10) Patent No.: US 12,550,666 B2
(45) Date of Patent: Feb. 10, 2026

(54) TOOL AND METHOD FOR CORRECTING POSITION OF WAFER IN SEMICONDUCTOR MANUFACTURING MACHINE

(71) Applicant: CHANGXIN MEMORY TECHNOLOGIES, INC., Hefei (CN)

(72) Inventor: Zhijiu Wang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 1130 days.

(21) Appl. No.: 17/453,884

(22) Filed: Nov. 8, 2021

(65) Prior Publication Data

US 2022/0230903 A1 Jul. 21, 2022

Related U.S. Application Data

(63) Continuation of application No. PCT/CN2021/112610, filed on Aug. 13, 2021.

(30) Foreign Application Priority Data

Jan. 18, 2021 (CN) .......................... 202110060868.0

(51) Int. Cl.
*H01L 21/67* (2006.01)
*H01L 21/68* (2006.01)

(52) U.S. Cl.
CPC ........ *H01L 21/67259* (2013.01); *H01L 21/68* (2013.01)

(58) Field of Classification Search
CPC .......................... H01L 21/67259; H01L 21/68
See application file for complete search history.

(56) References Cited

U.S. PATENT DOCUMENTS

| | | | |
|---|---|---|---|
| 8,134,688 B2* | 3/2012 | Shibazaki | G03F 9/70 355/68 |
| 2017/0010218 A1 | 1/2017 | He et al. | |
| 2019/0362998 A1* | 11/2019 | Handlos | H01L 23/544 |

FOREIGN PATENT DOCUMENTS

| CN | 101185035 A * | 5/2008 | ......... G03F 7/70775 |
|---|---|---|---|
| CN | 203895416 U | 10/2014 | |

(Continued)

OTHER PUBLICATIONS

International Search Report cited in PCT/CN2021/112610, mailed Nov. 11, 2021, 11 pages.

*Primary Examiner* — Eric A. Gates
(74) *Attorney, Agent, or Firm* — Kilpatrick Townsend & Stockton LLP (57) ABSTRACT

The present disclosure relates to a tool and method for correcting a position of a wafer in a semiconductor manufacturing machine, including: a cover plate, disposed on one side that is of the chamber away from the wafer bearing apparatus, the cover plate is provided with a mounting hole; a transparent plate, installed in the mounting hole, a projection of the wafer bearing apparatus on the transparent plate is located in the transparent plate; and a first scale and a second scale, disposed on the transparent plate, the first scale extends to edges of the transparent plate along a first direction and a direction away from the first direction, the second scale extends to edges of the transparent plate along a second direction and a direction away from the second direction, and the first scale and the second scale are provided with a plurality of uniformly distributed scale lines.

9 Claims, 3 Drawing Sheets

(56) References Cited

FOREIGN PATENT DOCUMENTS

| | | | | |
|---|---|---|---|---|
| CN | 204255806 U | | 4/2015 | |
| CN | 105629417 A | | 6/2016 | |
| CN | 108511377 A | * | 9/2018 | ....... H01L 21/67259 |
| CN | 210270511 U | | 4/2020 | |
| CN | 210516681 U | | 5/2020 | |
| CN | 211759736 U | | 10/2020 | |
| CN | 112103233 A | * | 12/2020 | ............. H01L 21/68 |
| CN | 112864071 A | | 5/2021 | |
| EP | 2071613 A1 | * | 6/2009 | ........... G01B 21/042 |
| KR | 20060088769 A | * | 8/2006 | ....... H01L 21/67259 |
| TW | 202016518 A | * | 5/2020 | ............ G01J 5/0205 |
| WO | WO-2007097350 A1 | * | 8/2007 | ......... G03F 7/70725 |

* cited by examiner

TOOL AND METHOD FOR CORRECTING POSITION OF WAFER IN SEMICONDUCTOR MANUFACTURING MACHINE

CROSS-REFERENCE TO RELATED APPLICATIONS

The present disclosure is a continuation application of International Patent Application No. PCT/CN2021/112610, filed on Aug. 13, 2021 and titled "TOOL AND METHOD FOR CORRECTING POSITION OF WAFER IN SEMICONDUCTOR MANUFACTURING MACHINE", which claims the priority to Chinese Patent Application No. 202110060868.0, titled "TOOL AND METHOD FOR CORRECTING POSITION OF WAFER IN SEMICONDUCTOR MANUFACTURING MACHINE" and filed on Jan. 18, 2021. The entire contents of International Patent Application No. PCT/CN2021/112610 and Chinese Patent Application No. 202110060868.0 are incorporated herein by reference.

TECHNICAL FIELD

The present disclosure relates to the technical field of semiconductors.

BACKGROUND

Currently, in the technical field of semiconductors, blind adjustment (that is, adjustment conducted based on experience and sense perception) is usually adopted to adjust a position of a wafer on a wafer bearing apparatus. However, the position of the wafer cannot be accurately adjusted through blind adjustment, and a lot of time needs to be taken to optimize the position of the wafer for multiple times, consuming a lot of time. Moreover, because a position of the wafer after blind adjustment is not quite accurate, a thickness, uniformity, and a particle quantity of a film layer of the fabricated wafer are affected. Consequently, a product yield of fabricated wafers is relatively low.

It should be noted that information disclosed in the above background section is used merely for a better understanding of the background of the present disclosure, and therefore may include information that does not constitute the prior art known to persons of ordinary skill in the art.

SUMMARY

According to some embodiments, a first aspect of the present disclosure provides a tool for correcting a position of a wafer in a semiconductor manufacturing machine. The semiconductor manufacturing machine is provided with a chamber, a wafer bearing apparatus is disposed on one side of the chamber, the wafer is placed on a surface that is of the wafer bearing apparatus close to the chamber, and there is a gap between the wafer and an edge of the wafer bearing apparatus; and the tool for correcting a position of a wafer in a semiconductor manufacturing machine includes:

a cover plate, disposed on one side that is of the chamber away from the wafer bearing apparatus, where the cover plate is provided with a mounting hole;

a transparent plate, installed in the mounting hole, where a projection of the wafer bearing apparatus on the transparent plate is located in the transparent plate, and the cover plate and the transparent plate cover the chamber; and a first scale and a second scale, disposed on the transparent plate, where the first scale extends to edges of the transparent plate along a first direction and a direction away from the first direction, the second scale extends to edges of the transparent plate along a second direction and a direction away from the second direction, and the first scale and the second scale are provided with a plurality of uniformly distributed scale lines, where the second direction and the first direction intersect with each other.

According to some embodiments, a second aspect of the present disclosure provides a method for correcting a position of a wafer in a semiconductor manufacturing machine. The method for correcting a position of a wafer in a semiconductor manufacturing machine is applied to the tool for correcting a position of a wafer in a semiconductor manufacturing machine according to any one of the foregoing embodiments, and the method for correcting a position of a wafer in a semiconductor manufacturing machine includes:

placing the tool for correcting a position of a wafer in a semiconductor manufacturing machine on the semiconductor manufacturing machine, and allowing a projection of the wafer bearing apparatus on the transparent plate to be located in the transparent plate;

placing the wafer on the wafer bearing apparatus;

observing a maximum gap between the wafer and an edge of the wafer bearing apparatus by the first scale and the second scale, and comparing the maximum gap with a preset threshold; and when the maximum gap is greater than the preset threshold, adjusting a position of the wafer based on the maximum gap and the preset threshold to make the maximum gap less than or equal to the preset threshold, or when the maximum gap is less than or equal to the preset threshold, holding the position of the wafer.

BRIEF DESCRIPTION OF THE DRAWINGS

The accompanying drawings incorporated into this specification and constituting a part of this specification illustrate embodiments of the present disclosure, and are used to explain the principles of the present disclosure together with this specification. Apparently, the accompanying drawings in the following description show merely some embodiments of the present disclosure, and persons of ordinary skill in the art may derive other drawings from these accompanying drawings without creative efforts.

DETAILED DESCRIPTION

Exemplary implementations will be described below in further detail with reference to the accompanying drawings. However, the exemplary implementations can be implemented in various forms, and should not be construed as being limited to those described herein. On the contrary, these exemplary implementations are provided to make the present disclosure comprehensive and complete and to fully convey the concept manifested therein to persons skilled in the art. Same reference numerals in the figures indicate same or similar structures, and thus their detailed descriptions will be omitted.

Although relative terms such as "on" and "below" are used in this specification to describe a relative relationship between one component and another component in components corresponding to the reference numerals, these terms are only used for convenience in this specification, for example, based on a direction in an example shown in the accompanying diagrams. It can be understood that if an apparatus corresponding to a reference numeral is turned upside down, a component described as "on" another component becomes a component described as "below" the another component. When a structure is "on" another structure, it may mean that the structure is integrally formed on the another structure, that the structure is "directly" disposed on the another structure, or that the structure is "indirectly" disposed on the another structure through another structure.

Terms "a", "one", and "the" are used to indicate the existence of one or more elements, components, or the like. Terms "include" and "have" are used to indicate an open-ended meaning of inclusion, and refer to that there may be other elements, components, or the like in addition to listed elements, components, or the like. Terms "first" and "second" are only used as markers and are not limited to a quantity of objects.

The present disclosure first provides a tool for correcting a position of a wafer in a semiconductor manufacturing machine. As shown in FIG. 1 to FIG. 6, the tool for correcting a position of a wafer 4 in a semiconductor manufacturing machine can accurately adjust and correct the position of the wafer 4. In this way, various indicators of the fabricated wafer 4 can all satisfy a preset requirement, thereby improving a product yield of fabricated wafers. The semiconductor manufacturing machine may be a semiconductor coating machine or a semiconductor etching machine. However, no limitation is set thereto. The semiconductor manufacturing machine may alternatively be an exotic semiconductor manufacturing machine. All these fall within the protection scope of the present disclosure.

Figure 1:
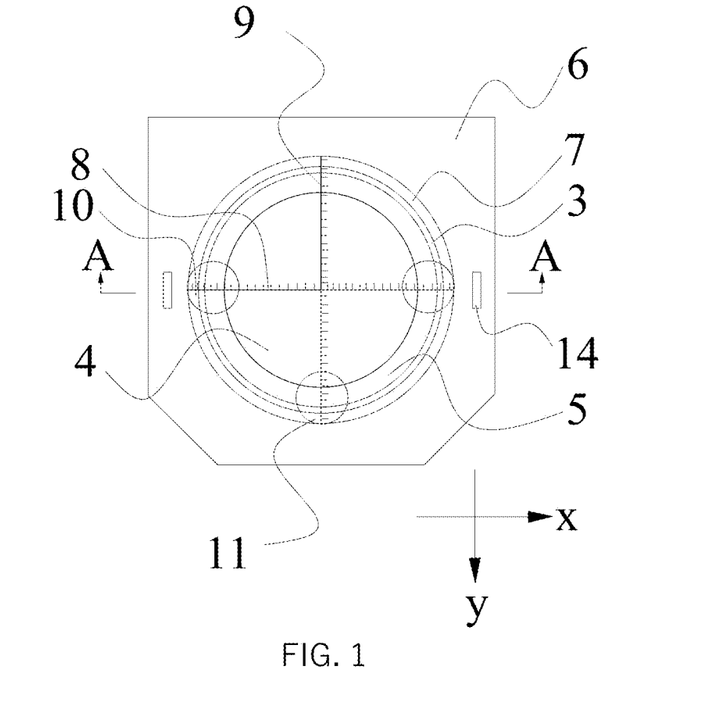
FIG. 1 is schematic assembly diagram of a tool for correcting a position of a wafer in a semiconductor manufacturing machine according to an exemplary embodiment of the present disclosure.
Figure 2:
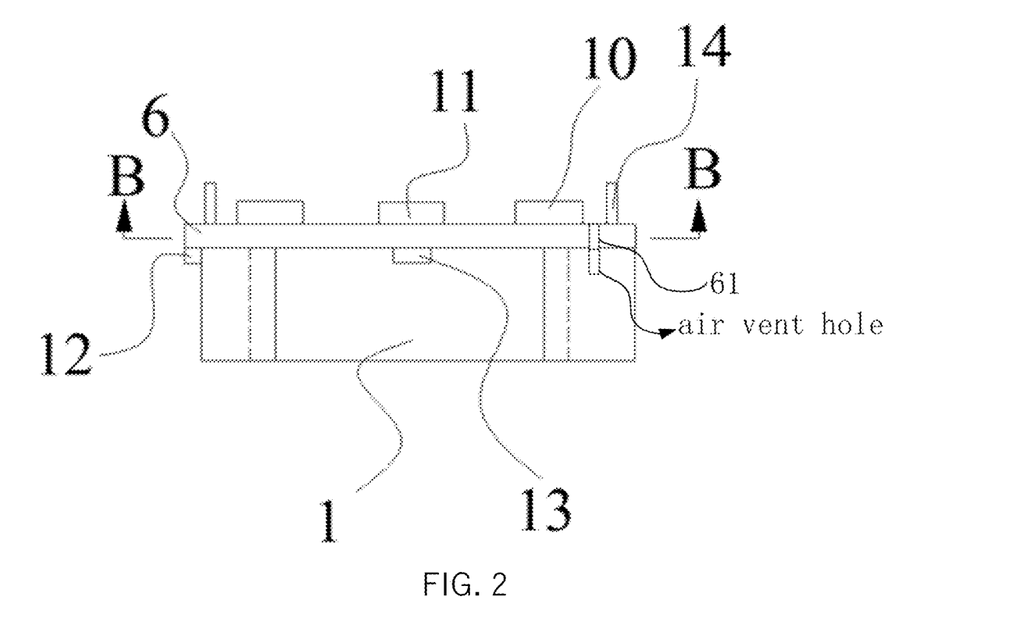
FIG. 2 is a schematic diagram of a front view of FIG. 1 according to an exemplary embodiment of the present disclosure.
Figure 3:
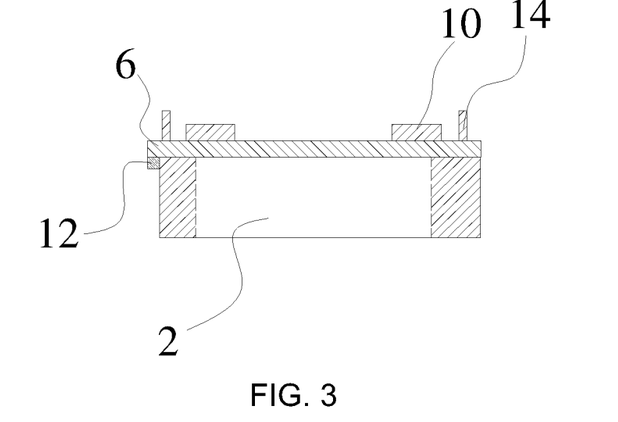
FIG. 3 is a schematic diagram of a cross section A-A in FIG. 1 according to an exemplary embodiment of the present disclosure.
Figure 4:
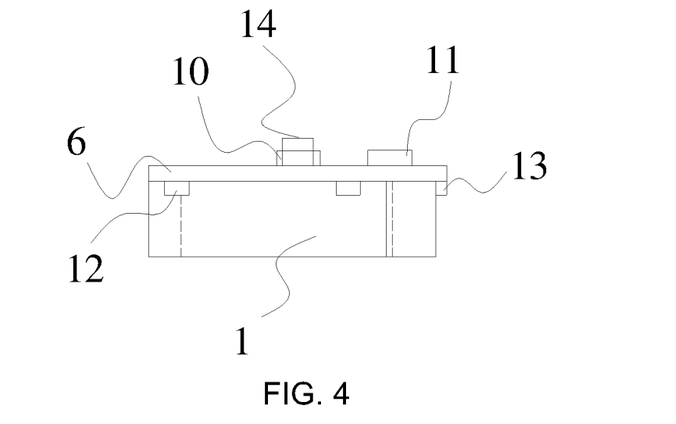
FIG. 4 is a schematic diagram of a left view of FIG. 1 according to an exemplary embodiment of the present disclosure.

The semiconductor manufacturing machine 1 may be provided with a chamber 2, and the chamber 2 may be provided with two openings: an upper opening and a lower opening. A wafer bearing apparatus 3 may be disposed on one side of the chamber 2. To be specific, the wafer bearing apparatus 3 may be located at one opening of the chamber 2. Further, the semiconductor manufacturing machine 1 may be provided with a machine cover and a machine body. The chamber 2 may be located in the machine body. The machine cover may be located on one side that is of the machine body away from the wafer bearing apparatus 3, and may be connected to the machine body. The machine cover can be rotated relative to the machine body. When the semiconductor manufacturing machine 1 conducts coating on the wafer 4, the wafer 4 may be placed on a surface that is of the wafer bearing apparatus 3 close to the chamber 2, the machine cover is rotated to seal the chamber 2, and then coating is conducted on the wafer 4.

The wafer bearing apparatus 3 may be provided with a bearing platform and at least one lifting column. The bearing platform may be located on one side that is of the wafer bearing apparatus 3 close to the chamber 2, and the wafer 4 can be placed on the bearing platform. The lifting column may pass through the bearing platform, and may move in directions away from and close to the bearing platform. When the wafer 4 needs to be placed on the bearing platform, the lifting column may move in the direction away from the bearing platform, and the wafer 4 may be placed on the lifting column. After the wafer 4 is placed on the lifting column, the lifting column may move in the direction close to the bearing platform, such that the wafer 4 is stably placed on the bearing platform. Therefore, by providing the lifting column on the wafer bearing apparatus 3, the wafer 4 can be placed more stably to prevent the wafer 4 from being damaged during placement of the wafer 4.

In an embodiment of the present disclosure, to place the wafer 4 more stably, the wafer bearing apparatus 3 may be provided with three lifting columns. However, no limitation is set thereto. Another quantity of lifting columns may be used in the present disclosure, and all these fall within the protection scope of the present disclosure.

Further, when the wafer 4 is placed on the bearing platform, there is a gap 5 between the wafer 4 and an edge of the wafer bearing apparatus 3. It can be understood that there may be the gap 5 between the wafer 4 and an edge of the bearing platform. In an embodiment of the present disclosure, the edge of the bearing platform may be on a same plane as a middle part of the bearing platform, or in other words, a thickness of the edge of the bearing platform is the same as that of the middle part of the bearing platform. Alternatively, the edge of the bearing platform may be higher than the middle part of the bearing platform, or in other words, the thickness of the edge of the bearing platform is greater than that of the middle part of the bearing platform. It should be noted that the edge of the bearing platform may be disposed around the middle part of the bearing platform.

In an embodiment of the present disclosure, the wafer bearing apparatus 3 may be a heater. In a semiconductor manufacturing process, the heater may heat the wafer 4 placed on the heater. However, no limitation is set thereto. The wafer bearing apparatus 3 may not be a heater, and this also falls within the protection scope of the present disclosure.

As shown in FIG. 1, the tool for correcting a position of a wafer in a semiconductor manufacturing machine may include a cover plate 6, a transparent plate 7, a first scale 8, and a second scale 9.

Specifically, the cover plate 6 may be disposed on one side that is of the chamber 2 away from the wafer bearing apparatus 3, and the cover plate 6 may be provided with a mounting hole.

In an embodiment of the present disclosure, a shape of the cover plate 6 may be the same as that of the side that is of the machine body away from the wafer bearing apparatus 3. For example, the shape of the side that is of the machine body away from the wafer bearing apparatus 3 may be a hexagon, where a length of a side that is of the hexagon and that is connected to the machine cover may be greater than that of a side that is opposite to the side connected to the machine cover. In this case, the shape of the cover plate 6 may be a hexagon, and a length of a side that is of the cover plate 6 close to the machine cover is greater than that of a side that is opposite to the side close to the machine cover. However, the shape of the cover plate 6 is not limited in the present disclosure. The shape of the cover plate 6 may alternatively not be the same as the shape of the side that is of the machine body away from the wafer bearing apparatus 3. All these fall within the protection scope of the present disclosure.

The cover plate 6 may be made of a metal material to withstand a high temperature generated by the semiconductor manufacturing machine 1. However, no limitation is set thereto, and the cover plate 6 may alternatively be made of another material, provided that the material is heat-resistant.

In an embodiment of the present disclosure, the semiconductor manufacturing machine 1 may be provided with at least one air vent hole. The air vent hole may provide air to the chamber 2 to make air pressure in the chamber 2 equal to external atmospheric pressure. When the semiconductor manufacturing machine 1 is provided with at least one air vent hole, as shown in FIG. 5, the cover plate 6 may include at least one air inlet hole 61 and at least one air outlet hole 62.

Figure 5:
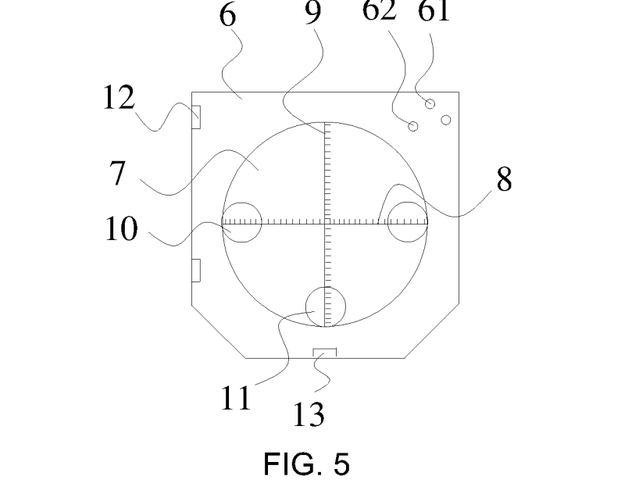
FIG. 5 is a schematic structural diagram, obtained from an upward angle of view, of a tool for correcting a position of a wafer in a semiconductor manufacturing machine according to an exemplary embodiment of the present disclosure.

It should be noted that, FIG. 5 is a schematic structural diagram, obtained from an upward angle of view, of a tool for correcting a position of a wafer in a semiconductor manufacturing machine. A direction of viewing upward described herein may be a direction from the semiconductor manufacturing machine 1 to the tool for correcting a position of a wafer in a semiconductor manufacturing machine. Therefore, it can be understood that, FIG. 5 is a schematic structural diagram of one side that is of the tool for correcting a position of a wafer in a semiconductor manufacturing machine close to the semiconductor manufacturing machine 1.

The at least one air inlet hole 61 may be located on one side that is of the cover plate 6 close to the chamber 2, and a quantity of air inlet holes 61 is the same as that of air vent holes. In addition, the air inlet hole 61 can be connected to the air vent hole to receive air released from the air vent hole. Specifically, when the semiconductor manufacturing machine 1 is provided with two air vent holes, the cover plate 6 may also be provided with two air inlet holes 61. In addition, the two air vent holes are in a one-to-one correspondence with the two air inlet holes 61. It can be understood that, each air vent hole may be connected to an air inlet hole 61 corresponding to the air vent hole.

Further, the air vent hole may be provided with a guiding section, and the guiding section may extend in a direction away from the semiconductor manufacturing machine 1. A diameter of the air inlet hole 61 may be greater than or equal to an outer diameter of the guiding section, such that the guiding section can extend into the air inlet hole 61, to make the air inlet hole 61 and the air vent hole connected better. Preferably, the diameter of the air inlet hole 61 is equal to the outer diameter of the guiding section, such that the guiding section and the air inlet hole 61 may fit with the gap 5, thereby preventing leakage of the air released by the air vent hole.

In an embodiment of the present disclosure, diameters of the air inlet hole 61 and the air outlet hole 62 may be 0.3 cm. However, no limitation is set thereto.

The at least one air outlet hole 62 is located on the side that is of the cover plate 6 close to the chamber 2, the air outlet hole 62 is close to the transparent plate 7 relative to the air inlet hole 61, and the air outlet hole 62 may be connected to the air inlet hole 61.

Figure 6:
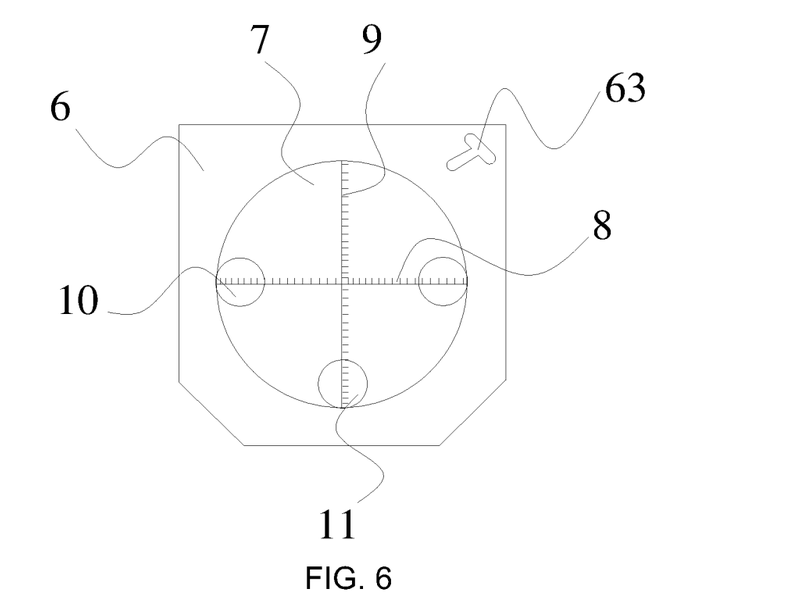
FIG. 6 is a schematic diagram of a cross section B-B in FIG. 2 according to an exemplary embodiment of the present disclosure.

In an embodiment of the present disclosure, as shown in FIG. 6, the cover plate 6 may include a connection channel 63, and the connection channel 63 may be located in the cover plate 6. The at least one air inlet hole and the at least one air outlet hole 62 respectively extend in a direction away from the chamber 2 and are connected to the connection channel 63, so as to connect the air inlet hole 61 to the air outlet hole 62 through the connection channel 63. By providing the connection channel 63, air can be better delivered and air leakage can be prevented.

In another embodiment of the present disclosure, the cover plate 6 may include a groove channel. The groove channel may be disposed on the side that is of the cover plate 6 close to the chamber 2, and the air outlet hole 62 may be connected to the air inlet hole 61 through the groove channel. Air can be delivered from the air inlet hole to the air outlet hole through the groove channel. A depth of the groove channel is not limited in the present disclosure, and may be set according to an actual requirement.

Further, when the semiconductor manufacturing machine 1 is provided with a plurality of air vent holes, the cover plate 6 may include a plurality of air inlet holes 61, and a plurality of air inlet holes 61 may be connected to each other. For example, a connection channel 63 may be disposed between a plurality of air inlet holes 61, and a plurality of air inlet holes 61 are connected to each other through the connection channel 63; or a groove channel may be disposed between a plurality of air inlet holes 61, and a plurality of air inlet holes 61 are connected to each other through the groove channel.

In an embodiment of the present disclosure, two air vent holes may be disposed around the chamber 2 of the semiconductor manufacturing machine 1. By providing the two air vent holes, a case in which the semiconductor manufacturing machine 1 cannot provide air to the chamber 2 when one of the air vent holes is faulty can be avoided. In addition, the cover plate 6 may be provided with two air inlet holes 61, and the two air inlet holes 61 are respectively connected to the air vent holes. However, a quantity of air vent holes around the chamber 2 and a quantity of air inlet holes 61 in the cover plate 6 are not limited in the present disclosure. For example, both the quantity of air vent holes and the quantity of air inlet holes 61 may be 3, 4, or the like.

In addition, the cover plate 6 may further be provided with a plurality of air outlet holes 62, and a plurality of air outlet holes 62 may be independent of each other or connected to each other. To be specific, a connection channel 63 may be disposed between a plurality of air outlet holes 62, and a plurality of air outlet holes 62 are connected to each other through the connection channel 63; or a groove channel may be disposed between a plurality of air outlet holes 62, and a plurality of air outlet holes 62 are connected to each other through the groove channel.

In an embodiment of the present disclosure, as shown in FIG. 1, the transparent plate 7 may be installed in the mounting hole, the projection of the wafer bearing apparatus 3 on the transparent plate 7 is located in the transparent plate 7, and the cover plate 6 and the transparent plate 7 may cover the chamber 2. By providing the transparent plate 7, the position of the wafer 4 in the chamber 2 can be observed more conveniently and clearly. In addition, because the projection of the wafer bearing apparatus 3 on the transparent plate 7 is located in the transparent plate 7, the transparent plate 7 can completely cover the wafer bearing apparatus 3, such that the value of the gap 5 between the wafer 4 and the edge of the wafer bearing apparatus 3 can be more conveniently observed by the first scale 8 and the second scale 9.

The transparent plate 7 may be made of quartz, such that the transparent plate 7 can have both relatively high transparency and relatively high heat resistance. This can prevent the transparent plate 7 from being damaged due to a high temperature in the chamber 2. However, no limitation is set thereto. The transparent plate 7 may alternatively be made of another material, provided that the material for making the transparent plate 7 can satisfy requirements of high transparency and relatively high heat resistance. It should be noted that the temperature in the chamber 2 is usually higher than 100° C.

Further, a shape of the transparent plate 7 may be the same as that of the wafer bearing apparatus 3. For example, when the shape of the wafer bearing apparatus 3 is a circle, the shape of the transparent plate 7 may also be a circle. When the shape of the wafer bearing apparatus 3 is a square, the shape of the transparent plate 7 may also be a square. This is not limited in the present disclosure. In addition, the shape of the transparent plate 7 may alternatively not be the same as that of the wafer bearing apparatus 3. For example, when the shape of the wafer bearing apparatus 3 is a circle, the shape of the transparent plate 7 may be a square, provided that the projection of the wafer bearing apparatus 3 on the transparent plate 7 is located in the transparent plate 7.

In addition, because the transparent plate 7 is installed in the mounting hole, the cover plate 6 may further include a support plate. The support plate may be located on the side that is of the cover plate 6 close to the chamber 2, and may extend toward a center of the mounting hole to support the transparent plate 7 to prevent the transparent plate 7 from falling off. However, the cover plate 6 may alternatively not include a support plate, and the transparent plate 7 may be installed in the mounting hole in another manner. For example, the transparent plate 7 may be installed in the mounting hole through interference fit; or the transparent plate 7 and the cover plate 6 may be fabricated integrally, such that the transparent plate 7 is installed in the mounting hole.

In an embodiment of the present disclosure, when the shape of the transparent plate 7 is a circle, a diameter of the transparent plate 7 may be 44 cm, and a thickness thereof may be 2 cm. However, no limitation is set thereto.

As shown in FIG. 1, the first scale 8 and the second scale 9 may be disposed on the transparent plate 7. It should be noted that the first scale 8 and the second scale 9 herein may be disposed in the transparent plate 7, may be disposed on one side that is of the transparent plate 7 away from the chamber 2, or may be disposed on one side that is of the transparent plate 7 close to the chamber 2. Preferably, to prevent impact on the accuracy of the first scale 8 and the second scale 9 caused due to a high temperature, the first scale 8 and the second scale 9 may be disposed in the transparent plate 7.

Further, the first scale 8 may extend to edges of the transparent plate 7 along a first direction x and a direction away from the first direction x, and the second scale 9 may extend to edges of the transparent plate 7 along a second direction y and a direction away from the second direction y. It should be noted that the direction away from the first direction x is a direction opposite to the first direction x, and the direction away from the second direction y is a direction opposite to the second direction y. The first scale 8 and the second scale 9 are allowed to extend to the edges of the transparent plate 7, such that the first scale 8 and the second scale 9 can extend to the gap 5 between the wafer 4 and the edge of the wafer bearing apparatus 3, thereby ensuring a specific value of the gap 5 observed by the first scale 8 and the second scale 9.

In addition, because the first direction x and the second direction y intersect with each other, the first scale 8 and the second scale 9 intersect with each other. Therefore, there may be four sections of projection of the first scale 8 and the second scale 9 in the present disclosure on the gap 5. In this case, the four sections of projection can be used as reference points in the present disclosure, and a specific position of the wafer 4 is observed more accurately by observing these reference points, thereby improving the accuracy of correcting the position of the wafer 4.

In an embodiment of the present disclosure, the first direction x may be perpendicular to the second direction y, or in other words, the first scale 8 and the second scale 9 may be perpendicular to each other, such that positioning is conducted more accurately.

In an embodiment of the present disclosure, the projection of a point of intersection between the first scale 8 and the second scale 9 on the transparent plate 7 may be located at a center of the transparent plate 7. To be specific, the second scale 9 may be divided into two parts with equal distances by the first scale 8, and the first scale 8 may be divided into two parts with equal distances by the second scale 9.

Further, the first scale 8 and the second scale 9 each may be provided with a plurality of uniformly distributed scale lines, and a spacing between two adjacent scale lines may be 0.01 mm. It can be understood that scale division values of the first scale 8 and the second scale 9 may be 0.01 mm. The value of the gap between the wafer 4 and the edge of the wafer bearing apparatus 3 can be accurately and intuitively observed by the scale lines of the first scale 8 and the second scale 9, so as to accurately adjust and correct the position of the wafer 4 based on the value of the gap. In this way, a thickness, uniformity, and a particle quantity of a film layer coated on the wafer 4 can satisfy a preset requirement. In addition, because the scale division values of the first scale 8 and the second scale 9 are 0.01 mm, the accuracy of correcting the position of the wafer 4 can reach 0.01 mm. However, if the prior art is used to blindly adjust the position of the wafer 4, an error of the blind adjustment is at least 0.5-1 mm.

Therefore, the position of the wafer 4 is adjusted by using the tool for correcting a position of a wafer in a semiconductor manufacturing machine provided in the present disclosure. Because the value of the gap can be intuitively observed by the scale lines, correction of the position of the wafer 4 can be completed by consuming a relatively short time. In addition, the tool for correcting a position of a wafer in a semiconductor manufacturing machine provided in the present disclosure can greatly improve the accuracy of correcting the position of the wafer 4.

As shown in FIG. 1, in an embodiment of the present disclosure, the tool for correcting a position of a wafer in a semiconductor manufacturing machine may further include a magnifying glass component. The magnifying glass component may be installed on the transparent plate 7. The first scale 8 and the second scale 9 may be located on one side that is of the magnifying glass component close to the chamber 2. A distance between two adjacent scale lines of each of the first scale 8 and the second scale 9 is only 0.01 mm. Therefore, the scale lines of the first scale 8 and the second scale 9 can be observed more clearly and accurately by the magnifying glass component.

Further, the projection of the gap 5 on the transparent plate 7 overlaps the projection of the magnifying glass component on the transparent plate 7. It should be noted that overlapping mentioned herein means that there is an intersection and overlapping part between the projection of the gap 5 on the transparent plate 7 and the projection of the magnifying glass component on the transparent plate 7. In addition, because the first scale 8 and the second scale 9 are located on the side that is of the magnifying glass component close to the chamber 2, it can be understood that the projection of the magnifying glass component, the first scale 8 and the second scale 9, and the gap 5 on the transparent plate 7 overlaps. Therefore, the specific value of the gap 5 can be observed more clearly and accurately by the magnifying glass component.

The magnifying glass component provided in the present disclosure may be directly formed on the transparent plate 7, or in other words, the magnifying glass component is formed on the transparent plate 7 during fabrication of the transparent plate 7. Alternatively, the magnifying glass component may be placed on the transparent plate 7. All these fall within the protection scope of the present disclosure.

In addition, the magnifying glass component may alternatively be located in the transparent plate 7. To be specific, a placement hole may be disposed at a corresponding position of the transparent plate 7, and the magnifying glass component is directly placed in the placement hole.

In an embodiment of the present disclosure, the second direction y may be a direction away from the machine cover, and the magnifying glass component may include two first magnifying glasses 10 and one second magnifying glass 11. Projections of the two first magnifying glasses 10 on the transparent plate 7 are respectively located at both ends of a projection of the first scale 8 on the transparent plate 7, and the projection of the two first magnifying glasses 10 on the transparent plate 7 both overlaps the projection of the gap 5 on the transparent plate 7. Therefore, the value of the gap 5 may be observed by the two first magnifying glasses 10.

A projection of the second magnifying glass 11 on the transparent plate 7 may be located at one end that is of the second scale 9 away from the machine cover, and overlaps the projection of the gap 5 on the transparent plate 7. The second magnifying glass 11 is placed at the end that is of the second scale 9 away from the machine cover. This can avoid an error in the accuracy of obtaining a reading caused by interference from the machine cover during reading obtaining.

However, a second magnifying glass 11 may alternatively be disposed at an end that is of the second scale 9 close to the machine cover. This also falls within the protection scope of the present disclosure.

In an embodiment of the present disclosure, the first magnifying glass 10 and the second magnifying glass 11 may be circular, diameters thereof may be 6 cm, and a thickness of a thickest part thereof may be 5 cm. However, no limitation is set thereto. Shapes, diameters, and thicknesses of the first magnifying glass 10 and the second magnifying glass 11 are not limited in the present disclosure.

In addition, as shown in FIG. 2 to FIG. 5, the tool for correcting a position of a wafer in a semiconductor manufacturing machine may further include at least one first positioning block 12 and at least one second positioning block 13, and the at least one first positioning block 12 and the at least one second positioning block 13 are located on the side that is of the cover plate 6 close to the chamber 2, and are connected to the cover plate 6. The at least one first positioning block 12 may be located at one edge of the cover plate 6, and the at least one second positioning block 13 may be located at the other edge of the cover plate 6. Sides that are of the first positioning block 12 and the second positioning block 13 and that are close to the transparent plate 7 may be attached to an edge of a side that is of the machine away from the chamber 2. The cover plate 6 can be positioned by the first positioning block 12 and the second positioning block 13, such that the cover plate 6 can be quickly and accurately placed on the machine.

In an embodiment of the present disclosure, the first positioning block 12 and the second positioning block 13 may be bosses. However, no limitation is set thereto. Shapes of the first positioning block 12 and the second positioning block 13 may be determined based on a shape of an edge of the machine. For example, when the edge of the machine is provided with a boss, the first positioning block 12 and the second positioning block 13 may be grooves or the like that fit with the boss at the edge of the machine.

Widths of the first positioning block 12 and the second positioning block 13 provided in the present disclosure may be 3 cm, and heights thereof are 2 cm. However, no limitation is set thereto. The widths and the heights of the first positioning block 12 and the second positioning block 13 are not limited in the present disclosure.

Further, as shown in FIG. 1, the tool for correcting a position of a wafer in a semiconductor manufacturing machine may further include at least one handle 14. The handle 14 may be located on one side that is of the cover plate 6 away from the chamber 2, and may be connected to the cover plate 6. By providing the handle 14, the tool for correcting a position of a wafer in a semiconductor manufacturing machine can be placed and removed more conveniently.

In an embodiment of the present disclosure, to place the correction tool more conveniently and stably, two handles 14 may be disposed along the first direction x, and the two handles 14 may be respectively located on both sides of the transparent plate 7.

The handle 14 may be door-shaped, a width of the handle 14 along the first direction x may be 2 cm, a length of the handle 14 along the direction perpendicular to the first direction x may be 10 cm, and a height of the handle 14 may be 8 cm. However, no limitation is set thereto.

In an embodiment of the present disclosure, the semiconductor manufacturing machine 1 may be provided with a plurality of chambers 2, and one wafer bearing apparatus 3 is disposed on one side of each chamber 2. In this case, the tool for correcting a position of a wafer in a semiconductor manufacturing machine may be provided with a plurality of transparent plates 7, and a plurality of wafer bearing apparatuses 3 may be in a one-to-one correspondence with a plurality of transparent plates 7. To be specific, a projection of each wafer bearing apparatus 3 on a transparent plate 7 corresponding to the wafer bearing apparatus 3 is located in the transparent plate 7, and the cover plate 6 and the transparent plate 7 may cover a chamber 2 in which the wafer bearing apparatus 3 is located.

Further, when the tool for correcting a position of a wafer in a semiconductor manufacturing machine may be provided with a plurality of transparent plates 7, each transparent plate 7 may be provided with one first scale 8 and one second scale 9, all the first scales 8 extend to the edges of the transparent plate 7 in the first direction x and the direction away from the first direction x, and all the second scales 9 extend to the edges of the transparent plate 7 in the second direction y and the direction away from the second direction y. In addition, each of the first scales 8 and the second scales 9 may be provided with a plurality of uniformly distributed scale lines.

Another aspect of the present disclosure provides a method for correcting a position of a wafer in a semiconductor manufacturing machine. The method can be applied to the foregoing tool for correcting a position of a wafer in a semiconductor manufacturing machine. According to the method for correcting a position of a wafer in a semiconductor manufacturing machine, the position of the wafer 4 can be accurately adjusted and corrected, such that various indicators of the fabricated wafer 4 can satisfy a preset requirement, thereby improving a product yield of fabricated wafers.

Figure 7:
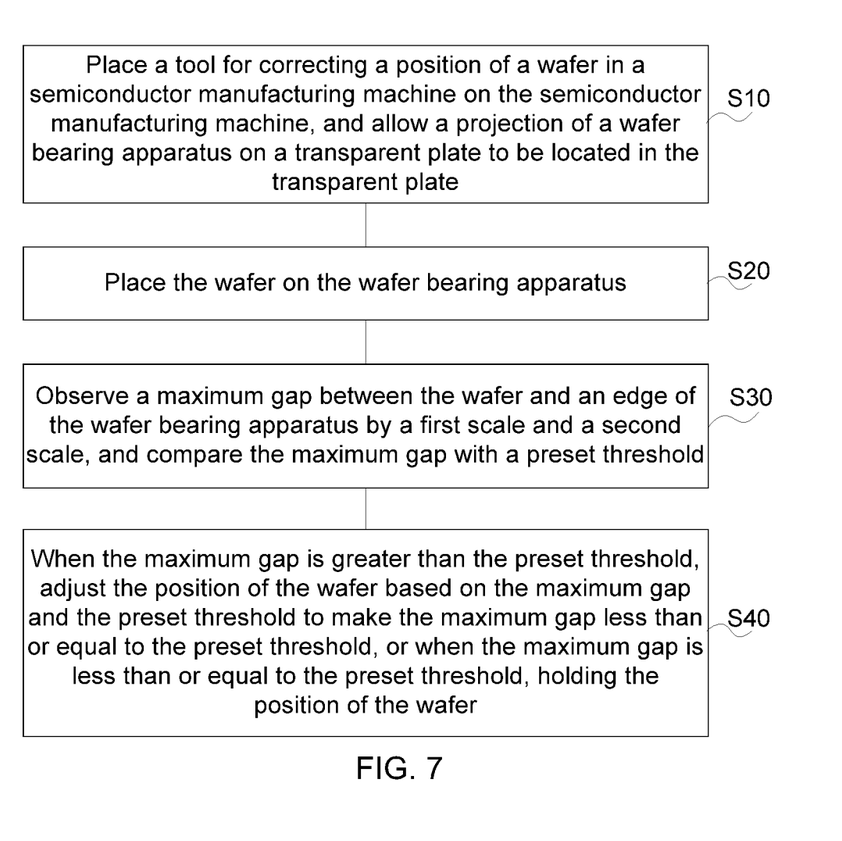
FIG. 7 is schematic flowchart of a method for correcting a position of a wafer in a semiconductor manufacturing machine according to an exemplary embodiment of the present disclosure.

Specifically, as shown in FIG. 7, the method for correcting a position of a wafer in a semiconductor manufacturing machine may include the following steps:

Step S10. Place the tool for correcting a position of a wafer in a semiconductor manufacturing machine on the semiconductor manufacturing machine 1, and allow the projection of the wafer bearing apparatus 3 on the transparent plate 7 to be located in the transparent plate 7.

Step S20. Place the wafer 4 on the wafer bearing apparatus 3.

Step S30. Observe a maximum gap 5 between the wafer 4 and an edge of the wafer bearing apparatus 3 by the first scale 8 and the second scale 9, and compare the maximum gap 5 with a preset threshold.

Step S40. When the maximum gap 5 is greater than the preset threshold, adjust the position of the wafer 4 based on the maximum gap 5 and the preset threshold to make the maximum gap 5 less than or equal to the preset threshold; or when the maximum gap 5 is less than or equal to the preset threshold, holding the position of the wafer 4.

The foregoing steps are described in details below.

In step S10, air may be introduced into the chamber 2 after the machine is cooled, to make air pressure in the chamber 2 equal to external atmospheric pressure, such that the machine cover of the semiconductor manufacturing machine 1 is opened. Then, the handle 14 is lifted to place the tool for correcting a position of a wafer in a semiconductor manufacturing machine on the semiconductor manufacturing machine 1, and the tool can be positioned by the first positioning block 12 and the second positioning block 13, to allow the projection of the wafer bearing apparatus 3 on the transparent plate 7 to be located in the transparent plate 7. Finally, air is pumped from the chamber 2 to make the chamber 2 in a low-pressure or vacuum state. By making the chamber 2 in a low-pressure or vacuum state, it can be ensured that an environment in which the wafer 4 is located in the process of correcting the position of the wafer 4 is the same as an environment in a fabrication process of the wafer 4, thereby ensuring the accuracy of correcting the position of the wafer 4.

In step S20, an instruction of placing the wafer 4 may be delivered to a mechanical arm, position coordinates may be transferred to an execution module of the mechanical arm through a control module of the mechanical arm, and finally the wafer 4 is placed on the wafer bearing apparatus 3 by the execution module through a through-wafer via in the semiconductor manufacturing machine 1. However, no limitation is set thereto. Alternatively, the wafer 4 may be manually placed on the wafer bearing apparatus 3.

Further, during placement of the wafer 4, the lifting column of the wafer bearing apparatus 3 may be raised. The wafer 4 may be placed on the lifting column by the mechanical arm, and the wafer 4 is stably placed on the bearing platform of the wafer bearing apparatus 3 by making the lifting column move down, so as to prevent the wafer 4 from being damaged during placement of the wafer 4 on the wafer bearing apparatus 3.

In step S30, a threshold of a gap 5 between the wafer 4 and the edge of the wafer bearing apparatus 3 may be preset. For example, the preset threshold may be 0.03 mm. However, no limitation is set thereto, and the preset threshold may be another value. Scales of the first scale 8 and the second scale 9 may be intuitively observed by the first magnifying glass 10 and the second magnifying glass 11 to observe the maximum gap 5 between the wafer 4 and the edge of the wafer bearing apparatus 3, and a value of the maximum gap 5 may be recorded. Then, the maximum gap 5 may be compared with the preset threshold.

In step S40, when the maximum gap 5 is greater than the preset threshold, it may be determined that the position of the wafer 4 is incorrect and needs to be adjusted. In this case, the position of the wafer 4 needs to be adjusted based on the maximum gap 5 and the preset threshold to make the maximum gap 5 less than or equal to the preset threshold. When the maximum gap 5 is less than or equal to the preset threshold, it may be determined that the position of the wafer 4 in this case is correct, and there is no need to adjust the position of the wafer 4.

In an embodiment of the present disclosure, the adjusting the position of the wafer 4 based on the maximum gap 5 and the preset threshold to make the maximum gap 5 less than or equal to the preset threshold, when the maximum gap 5 is greater than the preset threshold may include:

Step S401. When the maximum gap 5 is greater than the preset threshold, record a difference value between the maximum gap 5 and the preset threshold.

Step S402. Calculate new position coordinates of the wafer 4 based on the difference value between the maximum gap 5 and the preset threshold.

Step S403. Place the wafer 4 based on the new position coordinates, and compare a maximum gap 5 between the wafer 4 placed based on the new position coordinates and the edge of the wafer bearing apparatus 3 with the preset threshold.

Step S404. When the maximum gap 5 between the wafer 4 placed based on the new position coordinates and the edge of the wafer bearing apparatus 3 is less than or equal to the preset threshold, complete correction of the position of the wafer 4, or when the maximum gap 5 between the wafer 4 placed based on the new position coordinates and the edge of the wafer bearing apparatus 3 is greater than the preset threshold, adjust the position of the wafer 4 again based on the maximum gap 5 between the wafer 4 placed based on the new position coordinates and the edge of the wafer bearing apparatus 3 and the preset threshold to make the maximum gap 5 between the wafer 4 and the edge of the wafer bearing apparatus 3 less than or equal to the preset threshold, so as to complete correction of the position of the wafer 4.

Step S405. Deliver air into the chamber to make air pressure in the chamber equal to external atmospheric pressure, and take out the tool for correcting a position of a wafer in a semiconductor manufacturing machine from the semiconductor manufacturing machine.

Specifically, in step S403, the new coordinates may be sent to the control module of the mechanical arm, the control module of the mechanical arm sends the new coordinates to the execution module of the mechanical arm, and the execution module of the mechanical arm may place the wafer 4 based on the new coordinates. After the wafer 4 is placed, the maximum gap 5 between the wafer 4 placed based on the new position coordinates and the edge of the wafer bearing apparatus 3 may be observed by the first scale 8 and the second scale 9, and a value of the maximum gap 5 is recorded.

In step S404, when the maximum gap 5 between the wafer 4 placed based on the new position coordinates and the edge of the wafer bearing apparatus 3 is less than or equal to the preset threshold, it may be determined that a new position of the wafer 4 is correct, thereby completing correction of the position of the wafer 4. When the maximum gap 5 between the wafer 4 placed based on the new position coordinates and the edge of the wafer bearing apparatus 3 is greater than the preset threshold, it may be determined that a new position of the wafer 4 is still incorrect. In this case, steps S401 to S404 may be conducted again, or in other words, the position of the wafer 4 may be adjusted again based on the maximum gap 5 between the wafer 4 placed based on the new position coordinates and the edge of the wafer bearing apparatus 3 and the threshold. When the maximum gap 5 between the wafer 4 and the edge of the wafer bearing apparatus 3 is less than or equal to the preset threshold, correction of the position of the wafer 4 is completed.

In step S405, the air may be discharged to the air inlet hole 61 in the cover plate 6 through the air vent hole in the semiconductor manufacturing machine 1, and enter the chamber 2 through the air outlet hole 62 in the cover plate 6, to make the air pressure in the chamber 2 equal to the external atmospheric pressure. In this case, the tool for correcting a position of a wafer in a semiconductor manufacturing machine can be taken out from the semiconductor manufacturing machine only when the air pressure in the chamber 2 is equal to the external atmospheric pressure.

The accuracy of the tool for correcting a position of a wafer in a semiconductor manufacturing machine is 0.01 mm. Therefore, the method for correcting a position of a wafer in a semiconductor manufacturing machine provided in the present disclosure can correct the position of the wafer 4 more accurately. In addition, because adjustment and confirmation need to be conducted for many times during blind adjustment, it usually takes at least eight hours to correct the position of the wafer 4 once. In contrast, according to the method for correcting a position of a wafer in a semiconductor manufacturing machine provided in the present disclosure, in most cases, the position of the wafer 4 only needs to be adjusted once, thereby greatly shortening time required for correcting the position of the wafer 4 once.

Persons skilled in the art can easily figure out other implementation solutions of the present disclosure after considering this specification and practicing the present disclosure. The present disclosure is intended to cover any variations, purposes, or adaptive changes of the present disclosure. Such variations, purposes, or adaptive changes follow the general principle of the present disclosure and include common knowledge or conventional technical means in the technical field which is not disclosed in the present disclosure. This specification and the embodiments are merely considered as illustrative, and the real scope and spirit of the present disclosure are pointed out by the appended claims.

The invention claimed is:

1. A tool for correcting a position of a wafer in a semiconductor manufacturing machine, wherein the semiconductor manufacturing machine is provided with a chamber, a wafer bearing apparatus is disposed on one side of the chamber, the wafer is placed on a surface that is of the wafer bearing apparatus facing the chamber, and there is a gap between the wafer and an edge of the wafer bearing apparatus; and the tool for correcting a position of a wafer in a semiconductor manufacturing machine comprises:
    a cover plate, disposed on one side that is of the chamber away from the wafer bearing apparatus, wherein the cover plate is provided with a mounting hole;
    a transparent plate, installed in the mounting hole, wherein a projection of the wafer bearing apparatus on the transparent plate is located in the transparent plate, and the cover plate and the transparent plate cover the chamber;
    a first scale and a second scale, disposed on the transparent plate, wherein the first scale extends to edges of the transparent plate along a first direction and a direction away from the first direction, the second scale extends to edges of the transparent plate along a second direction and a direction away from the second direction, and the first scale and the second scale are provided with a plurality of uniformly distributed scale lines, wherein the second direction and the first direction intersect with each other; and
    a magnifying glass component, installed on the transparent plate, wherein the first scale and the second scale are located on one side that is of the magnifying glass component facing the chamber, and a projection of the gap on the transparent plate overlaps a projection of the magnifying glass component on the transparent plate; wherein the magnifying glass component comprises:
    two first magnifying glasses and one second magnifying glass, wherein
    projections of the two first magnifying glasses on the transparent plate are respectively located at both ends of a projection of the first scale on the transparent plate, and the projections of the two first magnifying glasses on the transparent plate both overlap the projection of the gap on the transparent plate; and
    a projection of the second magnifying glass on the transparent plate is located at one end that is of the second scale away from the machine cover, and overlaps the projection of the gap on the transparent plate.

2. The tool for correcting a position of a wafer in a semiconductor manufacturing machine according to claim 1, wherein the semiconductor manufacturing machine is provided with a machine cover and a machine body, the chamber is located in the machine body, and the machine cover is connected to one side that is of the machine body away from the wafer bearing apparatus, the second direction is a direction away from the machine cover.

3. The tool for correcting a position of a wafer in a semiconductor manufacturing machine according to claim 1, wherein the semiconductor manufacturing machine is provided with at least one air vent hole, and the cover plate comprises:
    at least one air inlet hole, located on one side that is of the cover plate facing the chamber, wherein a quantity of the air inlet holes is the same as a quantity of the air vent holes, and the air inlet hole is connected to the air vent hole to receive air released from the air vent hole; and
    at least one air outlet hole, located on the side that is of the cover plate facing the chamber, wherein the air outlet hole is closer to the transparent plate relative to the air inlet hole, and the air outlet hole is connected to the air inlet hole.

4. The tool for correcting a position of a wafer in a semiconductor manufacturing machine according to claim 3, wherein the cover plate comprises:
   a connection channel, wherein the connection channel is located in the cover plate; and
   the at least one air inlet hole and the at least one air outlet hole respectively extend in a direction away from the chamber and are connected to the connection channel, so as to connect the air inlet hole to the air outlet hole through the connection channel.

5. The tool for correcting a position of a wafer in a semiconductor manufacturing machine according to claim 1, wherein the tool for correcting a position of a wafer in a semiconductor manufacturing machine further comprises:
   at least one first positioning block and at least one second positioning block, wherein the at least one first positioning block and the at least one second positioning block are located on one side that is of the cover plate facing the chamber, and are connected to the cover plate, wherein
   the at least one first positioning block is located a tone edge of the cover plate, and the at least one second positioning block is located at the other edge of the cover plate.

6. The tool for correcting a position of a wafer in a semiconductor manufacturing machine according to claim 1, wherein the tool for correcting a position of a wafer in a semiconductor manufacturing machine further comprises:
   at least one handle, wherein the handle is located on one side that is of the cover plate away from the chamber, and is connected to the cover plate.

7. A method for correcting a position of a wafer in a semiconductor manufacturing machine, wherein the method for correcting a position of a wafer in a semiconductor manufacturing machine is applied to the tool for correcting a position of a wafer in a semiconductor manufacturing machine according to claim 1, and the method for correcting a position of a wafer in a semiconductor manufacturing machine comprises:
   placing the tool for correcting a position of a wafer in a semiconductor manufacturing machine on the semiconductor manufacturing machine, and allowing a projection of the wafer bearing apparatus on the transparent plate to be located in the transparent plate;
   placing the wafer on the wafer bearing apparatus;
   observing a maximum gap between the wafer and an edge of the wafer bearing apparatus by the first scale and the second scale, and comparing the maximum gap with a preset threshold; and
   when the maximum gap is greater than the preset threshold, adjusting a position of the wafer based on the maximum gap and the preset threshold to make the maximum gap less than or equal to the preset threshold, or when the maximum gap is less than or equal to the preset threshold, holding the position of the wafer.

8. The method for correcting a position of a wafer in a semiconductor manufacturing machine according to claim 7, wherein after the allowing a projection of the wafer bearing apparatus on the transparent plate to be located in the transparent plate and before the placing the wafer on the wafer bearing apparatus, the method for correcting a position of a wafer in a semiconductor manufacturing machine further comprises:
   pumping air from the chamber to make the chamber in a vacuum state.

9. The method for correcting a position of a wafer in a semiconductor manufacturing machine according to claim 8, wherein the adjusting a position of the wafer based on the maximum gap and the preset threshold to make the maximum gap less than or equal to the preset threshold, when the maximum gap is greater than the preset threshold comprises:
   when the maximum gap is greater than the preset threshold, recording a difference value between the maximum gap and the preset threshold;
   calculating a new position coordinate of the wafer based on the difference value between the maximum gap and the preset threshold;
   placing the wafer based on the new position coordinate, and comparing a maximum gap between the wafer placed based on the new position coordinate and the edge of the wafer bearing apparatus with the preset threshold;
   when the maximum gap between the wafer placed based on the new position coordinate and the edge of the wafer bearing apparatus is less than or equal to the preset threshold, completing correction of the position of the wafer, or when the maximum gap between the wafer placed based on the new position coordinate and the edge of the wafer bearing apparatus is greater than the preset threshold, adjusting the position of the wafer again based on the maximum gap between the wafer placed based on the new position coordinate and the edge of the wafer bearing apparatus and the preset threshold to make the maximum gap between the wafer and the edge of the wafer bearing apparatus less than or equal to the preset threshold, so as to complete correction of the position of the wafer; and
   delivering air into the chamber to make air pressure in the chamber equal to external atmospheric pressure, and taking out the tool for correcting a position of a wafer in a semiconductor manufacturing machine from the semiconductor manufacturing machine.

* * * * *